(12) United States Patent
Heau et al.

(10) Patent No.: US 9,103,016 B2
(45) Date of Patent: Aug. 11, 2015

(54) PART HAVING A DLC COATING AND METHOD FOR APPLYING THE DLC COATING

(75) Inventors: Christophe Heau, Saint Etienne (FR); Laurent Bombillon, Andrezieux Boutheon (FR); Philippe Maurin-Perrier, St. Marcellin en Forez (FR)

(73) Assignee: H.E.F., Andrezieux Boutheon (FR)

( * ) Notice: Subject to any disclaimer, the term of this patent is extended or adjusted under 35 U.S.C. 154(b) by 0 days.

(21) Appl. No.: 14/116,531

(22) PCT Filed: May 16, 2012

(86) PCT No.: PCT/FR2012/051109
§ 371 (c)(1),
(2), (4) Date: Nov. 8, 2013

(87) PCT Pub. No.: WO2012/156647
PCT Pub. Date: Nov. 22, 2012

(65) Prior Publication Data
US 2014/0087190 A1    Mar. 27, 2014

(30) Foreign Application Priority Data

May 19, 2011 (FR) ...................................... 11 54388

(51) Int. Cl.
*C23C 14/06* (2006.01)
*C23C 14/02* (2006.01)
*C23C 28/04* (2006.01)

(52) U.S. Cl.
CPC ........... *C23C 14/0611* (2013.01); *C23C 14/022* (2013.01); *C23C 14/024* (2013.01); *C23C 14/0605* (2013.01); *C23C 28/044* (2013.01); *C23C 28/046* (2013.01); *C23C 28/048* (2013.01); *Y10T 428/30* (2015.01)

(58) Field of Classification Search
USPC .................. 427/577, 471, 532, 534; 204/192, 204/192.1, 192.15, 192.16, 192.32, 192.35; 428/336, 408, 457, 698
See application file for complete search history.

(56) References Cited

U.S. PATENT DOCUMENTS

| | | | |
|---|---|---|---|
| 6,716,540 B2* | 4/2004 | Kohara et al. | 428/408 |
| 6,740,393 B1* | 5/2004 | Massler et al. | 428/336 |
| 7,498,093 B2* | 3/2009 | Shibata | 428/832.1 |
| 7,887,919 B2* | 2/2011 | Yamamoto et al. | 428/698 |

(Continued)

FOREIGN PATENT DOCUMENTS

DE    102007058356 A1    12/2008
EP    2362000 A1    8/2011

(Continued)

OTHER PUBLICATIONS

Rebholz et al "Depostion and charasterisation of carbon-contining tungsten coatings prepared by reactivie magentron sputtering" Vauum, vol. 49, vol. 4 (1998) pp. 265-272.*
International Search Report for PCT/FR2012/051109 dated Jul. 25, 2012.

*Primary Examiner* — Archene Turner
(74) *Attorney, Agent, or Firm* — Heslin Rothenberg Farley & Mesiti P.C.

(57) ABSTRACT

A part has a layer with a WC-C composition gradient, with the exception of a metal-containing undercoat and with the exception of an ion implantation layer and a DLC surface layer having cohesive behavior in scratch tests.

14 Claims, 4 Drawing Sheets

Section A-A: adhesive flaking

(56) References Cited

U.S. PATENT DOCUMENTS

| | | | |
|---|---|---|---|
| 8,574,715 B2 * | 11/2013 | Ito et al. | 428/408 |
| 8,652,620 B2 * | 2/2014 | Fischer et al. | 428/212 |
| 8,808,858 B2 * | 8/2014 | Akari et al. | 428/408 |
| 2012/0205875 A1 * | 8/2012 | Kennedy et al. | 277/442 |

FOREIGN PATENT DOCUMENTS

| | | | |
|---|---|---|---|
| JP | 2003-171758 | * | 6/2003 |
| WO | 0179585 A1 | | 10/2001 |
| WO | 2010/050542 | * | 5/2010 |
| WO | 2011018252 A1 | | 2/2011 |

* cited by examiner

PART HAVING A DLC COATING AND METHOD FOR APPLYING THE DLC COATING

CROSS REFERENCE TO RELATED APPLICATIONS

This application is a national stage filing under section 371 of International Application No. PCT/FR2012/051109 filed on May 16 2012, and published in French on Nov. 22, 2012 as WO 2012/156647 A1 and claims priority of French application No. 1154388 filed on May 19, 2011, the entire disclosure of these applications being hereby incorporated herein by reference.

BACKGROUND ART

The invention relates to the technical field of DLC (Diamond-Like Carbon) coatings, especially those for friction parts.

The invention has an especially advantageous application in reducing the coefficient of friction, of piston rods, camshafts, valve lifters, cylinders, piston rings etc. for example and, more generally, in all cases of friction under load. In order to reduce such friction, those skilled in the art are perfectly aware of the possibility of applying a DLC coating to the part or parts in question.

The invention may also have applications where there is a requirement for the surface provided by the coating to have a black colour without this involving any attempt to reduce friction.

It is also generally known by those skilled in the art that the low adhesion of DLC films on components is capable of posing real problems in certain applications. One technical solution in order to improve adhesion involves using a metal-containing adhesive layer based on silicon or chromium for instance. Various technical solutions have been proposed.

Document WO2011/018252, for example, describes a friction part having a coating consisting of an adhesive layer, a metal-containing DLC coating and a metal-free DLC coating. The adhesive layer is preferably a chromium coating having a maximum thickness of 1 μm whereas the metal-containing DLC coating is preferably made of WCC tungsten carbide. The ratios of the thicknesses of the various layers and coatings are limited to certain ranges of values so that, outside these ranges, if the DLC thickness is too small, the service life of the component will be shortened and if the DLC thickness is too large, the component will wear prematurely with risks of peeling or flaking off.

Document WO0179585 discloses a multilayer system having an adhesive layer, a transition layer and a layer of diamond-like carbon. The adhesive layer comprises an element in the 4th, 5th or 6th subgroup and silicon whereas the transition layer comprises carbon and at least one element in the 4th, 5th or 6th subgroup and silicon. The upper layer is predominantly made of diamond-like carbon. The system has a hardness of at least 15 GPa and an adhesive strength of at least HF3.

Generally speaking, delamination of the DLC film from this undercoat associated with internal stresses in the DLC film is observed and this delamination increases the thicker such a film is. It is also apparent that this adhesive undercoat is formed in a separate step and that this increases the cost of the method and makes such a method more complicated.

The invention has set itself the object of overcoming these drawbacks in a simple, dependable, effective and efficient manner.

The problem which the invention intends to solve is to produce DLC films having improved adherence without using a metal-containing adhesive undercoat (e.g. silicon or chromium) based on the teaching of the prior art.

BRIEF SUMMARY OF THE INVENTION

In order to solve such a problem, a metal part having a layer with a WC-C composition gradient, with the exception of a metal-containing undercoat, and a DLC surface layer characterised by cohesive behaviour in scratch tests has been designed and perfected.

The stated problem is advantageously solved by a method in which one:
microwave etches the part;
subjects the part to a WC-C composition gradient layer;
uses a microwave plasma to apply the DLC coating to the WC-C layer;

Microwave etching makes it possible to obtain more effective etching (regardless of the geometry of the part that is to be treated) than is possible using diode etching by adjusting the flow of ions. It is also possible to etch parts at a low tempering temperature without degrading them. It is also observed that using a microwave DLC coating makes it possible to reduce the application process time by roughly 50% compared with a conventional DLC coating.

Advantageously, one creates an argon plasma in order to obtain etching over a pressure range from 0.05 to 0.5 Pa.

According to another aspect, one produces the WC-C composition gradient layer by using a magnetron PVD technique. One starts with a first pure WC layer followed by a ramp with a hydrocarbon gas such as $C_2H_2$ followed finally by a WC-C layer. The thickness of the WC-C composition gradient layer is 0.3 to 10 μm and advantageously 0.8 μm for most applications, apart from those that require bigger thicknesses such as piston rings According to another aspect, the DLC coating has a thickness of 1 to 20 μm.

The invention also relates to a friction part having a DLC coating applied to a WC-C composition gradient layer which the microwave-etched part has.

BRIEF DESCRIPTION OF THE DRAWING FIGURES

The invention is explained below in greater detail, reference being made to the accompanying drawings in which.

DETAILED DESCRIPTION

As indicated, the prior art describes DLC coatings that include, in every case, an adhesive undercoat made of pure Cr, for example, followed by a tungsten carbide-based layer in which the carbon content is gradually increased until a tungsten-doped DLC layer is obtained with the objective of ensuring the adhesion of deposited DLC that is not doped with metal.

In the context of the invention, tests have been performed in order to compare the results obtained by producing DLC coatings with one or more adhesive undercoats and a DLC coating that does not use an adhesive layer in accordance with the aspects of the invention.

Materials were deposited on metal-containing substrates that had previously been ion etched in order to eliminate any superficial oxide so as to improve adhesion of the coating. Various ion etching technologies are familiar to those skilled in the art, namely, mainly, diode etching, triode plasma etching and ECR microwave etching.

Diode etching involves applying a negative voltage of several hundred volts (<−500V) to the substrates in an argon atmosphere at a pressure of 1 to 10 Pa. Under these conditions, there is a luminous discharge around the parts and positive argon ions in the plasma bombard the surface of the substrate allowing surface sputtering and the elimination of oxide.

Using triode plasma technology, a dense argon plasma at a lower pressure (0.1 to 1 Pa) is produced by a plasma amplifier. The positive argon ions are accelerated by negatively biasing the substrate and they etch the surface. For this type of method, the negative voltage must be between −250 V and −500 V in order to achieve maximum etching efficiency.

ECR microwave etching makes it possible to produce an argon plasma over a pressure range of 0.05 to 0.5 Pa. The parts are biased by a negative voltage which is optimally −50 V to −250 V.

Each of these etching technologies was used for these tests. Following etching, a pure chromium adhesive undercoat was produced on some of the test pieces by magnetron cathode sputtering in order to obtain a chromium thickness of approximately 0.1 to 0.2 μm. Tungsten carbide was then deposited on all the test pieces by magnetron cathode sputtering, gradually increasing the hydrocarbon flow rate making it possible to enrich the deposited carbon to an atomic concentration in excess of 50% in order to enable adhesion of the final DLC coating. The tungsten-containing layer had a thickness of approximately 0.5 μm and the DLC was approximately 2 μm thick, apart from examples 9 and 10 where the thickness of the tungsten-containing layer was increased to 1.5 μm.

The following table summarises the test conditions.

| Etching technology | Presence of a Cr adhesive layer |
|---|---|
| Diode | Yes |
| Diode | No |
| Triode | Yes |
| Triode | No |
| ECR | Yes |
| ECR | No |

Figure 1:
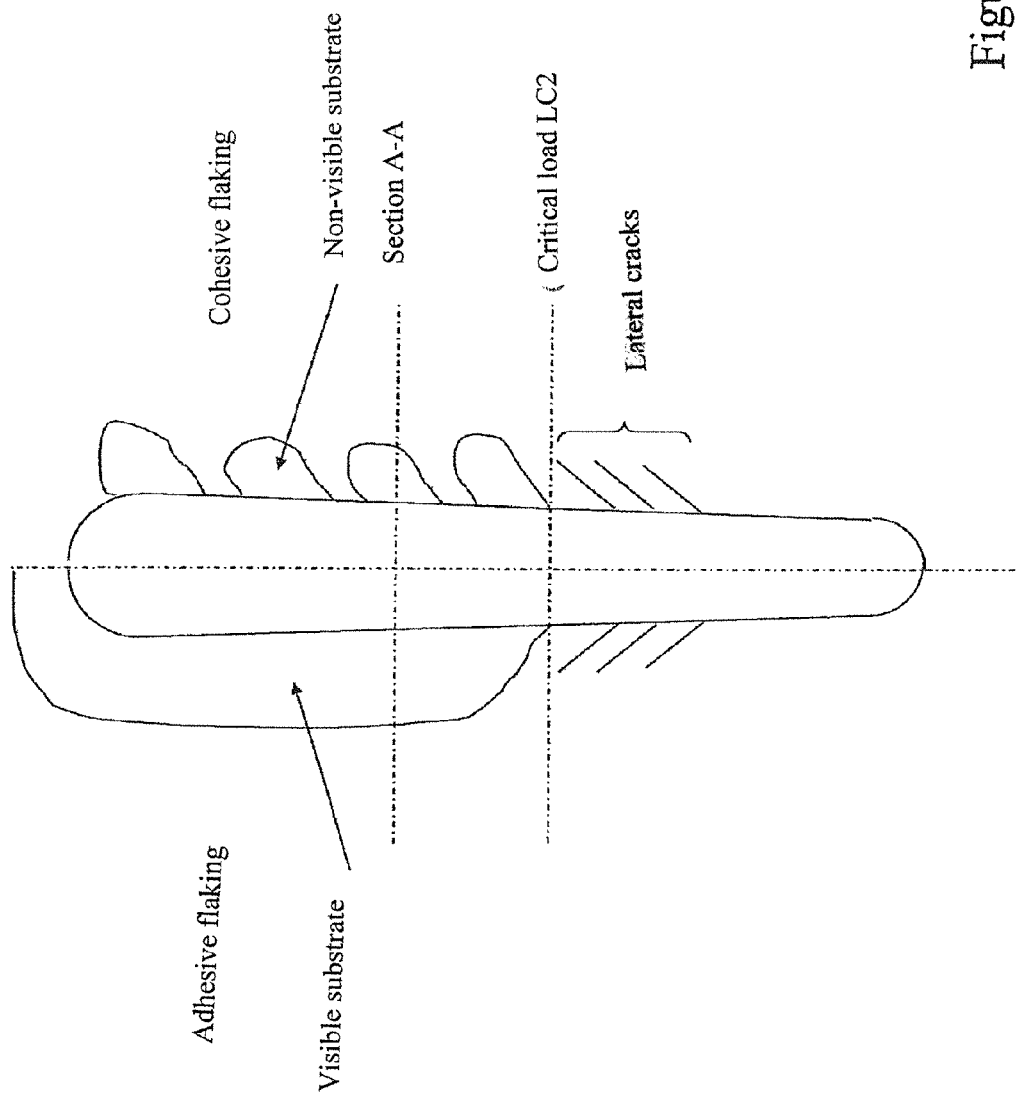
FIG. 1 is a view of the fracture profile of the coating using the scratch test method.
Figure 2:
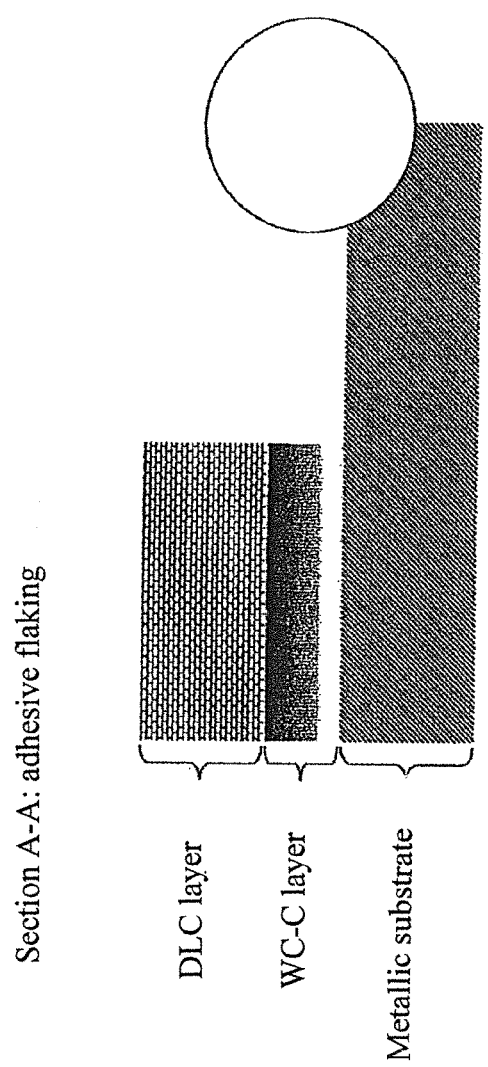
FIG. 2 is a cross-sectional view along line A-A in FIG. 1 in the case of adhesive flaking.
Figure 3:
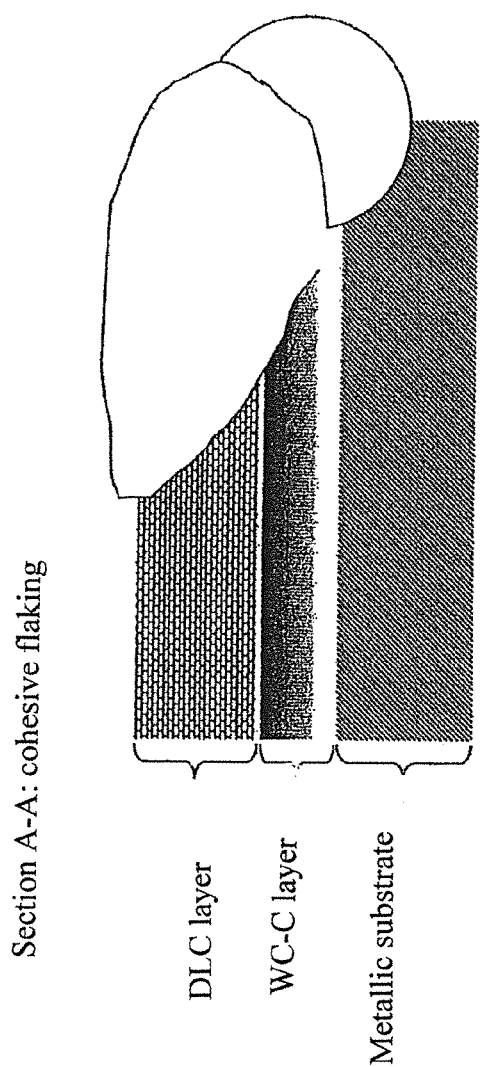
FIG. 3 is a cross-sectional view along line A-A in FIG. 1 in the case of cohesive flaking.

All the coatings were characterised in terms of their adhesion. The scratch test method was used. The reader is reminded that this method involves scratching the surface of the deposited material with a diamond such as those used for the HRC indentation test. A gradually increasing load is applied while the test piece is translationally moved at constant speed underneath the diamond. This makes it possible to obtain an increasing-load scratch (FIG. 1) on the basis of which it is possible to determine a flaking force (critical load) as well as the flaking mode. The flaking mode indicates the location of the break in the coating. There are two main types of flaking:

Adhesive flaking (FIG. 2)
Cohesive flaking (FIG. 3)

Figure 4:
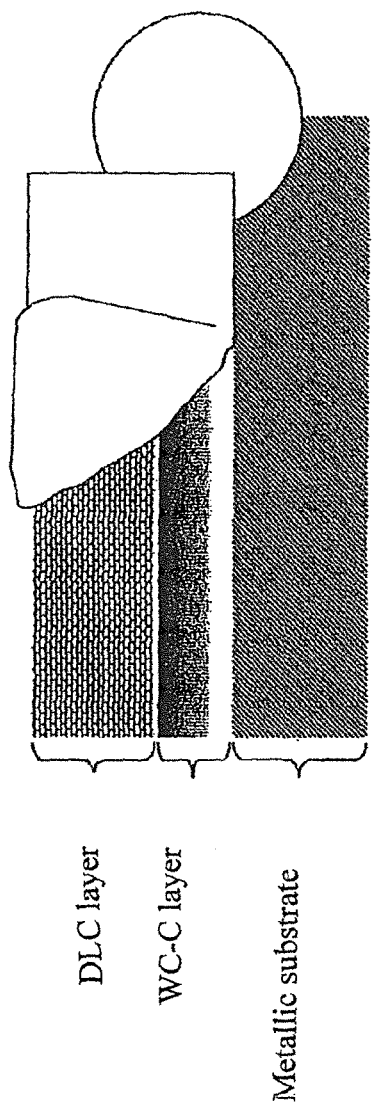
FIG. 4 is a cross-sectional view along line A-A in FIG. 1 in the case of cohesive/adhesive flaking.

There is a mixed mode which combines adhesive fracture with cohesive fracture which is referred to as cohesive/adhesive (FIG. 4).

Adhesive flaking corresponds to the propagation of cracks along one interface and hence parallel to the surface of the part whereas cohesive flaking propagates through the coating at an oblique angle relative to the interfaces. Adhesive flaking characterises lack of adhesion of the coating. Cohesive flaking occurs when the stresses exceed the breaking limit (mechanical strength) of the materials that constitute the coating.

In the case of the adhesive facies, the critical load characterises the adhesion force.

In the case of a cohesive failure, it is the breaking strength of the coating that is characterised, not its adhesion. The critical load is not only a characteristic of the deposited material, it is also a characteristic of its thickness and the hardness of the substrate.

A second method was used to evaluate adhesion. It involves indenting the deposited material by using a Vickers diamond under a load of 2 kg.

The table below summarises the series of experiments including the results of the scratch test obtained on substrates made of tool steel (hardness 64 HRC) for total deposited thicknesses of 2.5 μm without a chromium undercoat and 2.7 μm with a chromium undercoat and a total thickness of 3.5 μm in the case of examples 9 and 10. Examples 11 and 12 have thick stacks which demonstrate the robustness of the invention. Example 11 comprises a 4 μm thick tungsten-based layer on which an 8 μm thick DLC had been deposited. In the case of example 12, the thickness of the tungsten layer was increased to 9.7 μm and that of the DLC surface layer was increased to 19.2 μm.

| Example | Etching technology | Presence of a Cr adhesive layer | Etching pressure in Pa | Critical load in N | Facies | Vickers indentation with 2 kg (20N) |
|---|---|---|---|---|---|---|
| 1. | Diode | Yes | 2 | 32 | C | NTR |
| 2. | Diode | No | 2 | 6 | A | NTR |
| 3. | Triode | Yes | 0.6 | 33 | C | NTR |
| 4. | Triode | No | 0.6 | 8 | A | NTR |
| 5. | Triode | No | 0.4 | 18 | CA | NTR |
| 6. | ECR | Yes | 0.5 | 32 | C | NTR |
| 7. | ECR | No | 0.5 | 18 | CA | NTR |
| 8. | ECR | No | 0.3 | 31 | C | NTR |
| 9. | ECR | No | 0.3 | 36 | C | NTR |
| 10. | ECR | No | 0.3 | 35 | C | NTR |
| 11. | ECR | No | 0.3 | 44 | C | NTR |
| 12. | ECR | No | 0.3 | 55 | C | NTR |

C = Cohesive
A = Adhesive
CA = Cohesive/adhesive
NTR = No detachment of deposited material The above table shows that, in the case of diode etching and in accordance with the teaching of the prior art, the chromium undercoat makes it possible to obtain strong adhesion (example 1) and that, in its absence, failure occurs at the interface between the WC and the steel (example 2).

Using triode etching technology results in a change in the behaviour of the deposited material when it is scratched without a chromium undercoat (examples 4 and 5). The critical load increased compared with diode etching (example 2) and the flaking mode changed (examples 4 and 5).

The observed flakes reveal an intermediate flaking mode.

According to the invention, using ECR microwave etching technology demonstrates that it is possible to obtain mechanical behaviour that is quite similar to the prior art without a chromium undercoat (example 8). Note that, as with triode etching technology, reducing the pressure results in improved scratch test performance (examples 7 and 8).

Examples 9 and 10 show that resistance to cohesive flaking is increased by the thickness of the tungsten-containing undercoat, as demonstrated by the critical load values. In the two examples, the thickness of the tungsten carbide and the gradient layer is 1.5 µm. More especially, in example 9, the tungsten-carbide thickness was increased to 1 µm, the thickness which corresponds to the carbon concentration gradient is 0.5 µm. In example 10, the tungsten-carbide thickness is 0.2 µm, whereas the carbon concentration gradient layer is increased to 1.3 µm.

Examples 11 and 12 illustrate the robustness of the solution. It is known that increasing the thickness of thin hard layers deposited in a vacuum results in an increase in their internal compression stresses. Nevertheless, behaviour during the scratch test remains cohesive and the increase in the critical load is the result of increasing the thickness of the tungsten-based layer.

Over and above the etching technology, the results tend to show an improvement in the adhesion of the layers produced without a chromium undercoat when the etching pressure is diminished. The pressure reduction during etching depends on the actual technology itself. Diode technology is typically incapable of generating plasma pressures as low as 0.5 Pa.

Thus, according to the invention, using an appropriate etching technology makes it possible to reduce the argon pressure and produce a DLC type adhering stack without a chromium undercoat—an achievement that flies in the face of everything that is widely held by those skilled in the art and previous technical solutions.

The method according to the invention has numerous advantages:

Besides simplifying the equipment needed and reducing its cost, eliminating the adhesive undercoat also eliminates one interface and therefore improves the reliability and robustness of the coating.

It is also apparent, as revealed by the tests that were conducted, that the chromium undercoat tends to mask deficiencies in certain types of etching, in contrast to tungsten carbide which appears to require more effective etching, in order to perform as well in terms of adhesion, as a material that is deposited with a chromium undercoat.

Also, using Vickers indentation with a 2 kg load did not make it possible to reveal any differences in the adhesion of various types of deposited materials. Although the applied load was 2 kg (20 N), the deformation caused by the Vickers diamond was insufficient to cause detachment of the deposited materials, as in example 2, where adhesion has nevertheless been proven deficient by the scratch test method.

The invention claimed is:

1. A metal part having a layer with a WC-C composition gradient, without a metal-containing adhesive undercoat and without an ion implantation layer, and a DLC surface layer having cohesive behaviour in scratch tests.

2. The metal part as claimed in claim 1 covered in a DLC coating applied to a WC-C composition gradient layer wherein the part that has a microwave etched surface.

3. A method for applying a DLC coating to a metal part, without employing a metal-containing adhesive undercoat, comprising:
   microwave etching the part,
   subjecting the part to a WC-C composition gradient layer,
   using a microwave plasma to apply the DLC coating to the WC-C layer.

4. The method as claimed in claim 3, wherein said microwave etching comprises generating an argon plasma in order to etch over a pressure range of 0.05 to 0.5 Pa.

5. The method as claimed in claim 3, wherein the WC-C composition gradient layer is produced by magnetron PVD.

6. The method as claimed in claim 5, wherein the subjecting comprises: starting with a first pure WC layer, followed by a hydrocarbon flow rate ramp, finally followed by a WC-C layer.

7. The method as claimed in claim 5, wherein thickness of the WC-C composition gradient layer is 0.3 to 10 µm.

8. The method as claimed in claim 3, wherein the DLC coating has a thickness of 1 to 20 µm.

9. A metal part covered in a DLC coating obtained exclusively using the method as claimed in claim 3, characterised by the absence of a metal-containing adhesive undercoat and by the absence of an ion implantation layer and having a WC-C composition gradient.

10. The method as claimed in claim 7, wherein the thickness of the WC-C composition gradient layer is 0.8 µm.

11. A method for applying a DLC coating to a metal part, consisting of:
    microwave etching the part,
    subjecting the part to a WC-C composition gradient layer,
    using a microwave plasma to apply the DLC coating to the WC-C layer.

12. The method as claimed in claim 11, wherein the microwave etching comprises generating an argon plasma and etching over a pressure range of 0.05 to 0.5 Pa, and
    wherein the WC-C composition gradient layer is produced by magnetron PVD.

13. The method as claimed in claim 12, wherein the subjecting comprises: starting with a first pure WC layer, followed by a hydrocarbon flow rate ramp, finally followed by a WC-C layer, and thickness of the WC-C composition gradient layer is 0.3 to 10 µm.

14. A metal product covered in a DLC coating obtained exclusively using the method as claimed in claim 11, characterized by the absence of a metal-containing adhesive undercoat and by the absence of an ion implantation layer, and having a WC-C composition gradient.

* * * * *